US007647573B2

(12) United States Patent
Abadir et al.

(10) Patent No.: US 7,647,573 B2
(45) Date of Patent: Jan. 12, 2010

(54) METHOD AND DEVICE FOR TESTING DELAY PATHS OF AN INTEGRATED CIRCUIT

(75) Inventors: Magdy S. Abadir, Austin, TX (US); Jing Zeng, Dripping Springs, TX (US); Benjamin N. Lee, Santa Barbara, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 358 days.

(21) Appl. No.: 11/442,196

(22) Filed: May 26, 2006

(65) Prior Publication Data

US 2007/0277135 A1   Nov. 29, 2007

(51) Int. Cl.
  *G06F 17/50* (2006.01)
(52) U.S. Cl. ............................................. 716/6; 716/5
(58) Field of Classification Search ................. 716/4–6
  See application file for complete search history.

(56) References Cited

U.S. PATENT DOCUMENTS

| 6,907,590 B1* | 6/2005 | Al-Dabagh et al. ............ 716/6 |
| 6,917,237 B1 | 7/2005 | Tschanz et al. |
| 7,062,410 B2* | 6/2006 | Winstead et al. ............ 702/183 |
| 7,137,080 B2 | 11/2006 | Acar et al. |
| 7,337,100 B1* | 2/2008 | Hutton et al. ................. 703/13 |
| 2005/0273736 A1* | 12/2005 | Youngman et al. ............. 716/4 |

OTHER PUBLICATIONS

Aseem Agarwal, Statistical Timing Analysis for Intra_Die Process Variations with Spatial Correlations, ICCAD, Nov. 11-13, 2003, San Jose, California, USA, pp. 900-907.
A. Krstic, Delay defect diagnosis based upon a statistical timing model—the first step,IEE Proc.-Comput. Digit. Tech., vol. 150, No. 5, Sep. 2003, pp. 346-354.
Farid N. Najm, On the Need for Statistical Timing Analysis, DAC, Jun. 13-17, 2005 Anaheim, California, USA, pp. 764-765.
Liqiong Wei, Design and Optimization of Low Voltage High Performance Dual Threshold CMOS Circuits, School of Electrical and Computer Engineering, Purdue University, W. Lafayette, In, USA, 6 pages.

* cited by examiner

*Primary Examiner*—Vuthe Siek

(57) ABSTRACT

A method of testing critical delay paths of an integrated circuit design is disclosed. The method includes predicting and ranking a set of critical delay paths based on a set of predicted delay characteristics. Integrated circuits based on the integrated circuit design are tested to determine a set of actual delay measurements for the critical delay paths. The critical delay paths are ranked based on the actual delay measurements, and the results are correlated to the predicted ranking of critical delay paths to produce a confidence measurement that measures the likelihood that the actual critical delay paths of the design have been tested for a given production batch of devices.

20 Claims, 3 Drawing Sheets

METHOD AND DEVICE FOR TESTING DELAY PATHS OF AN INTEGRATED CIRCUIT

FIELD OF THE DISCLOSURE

The present disclosure is related to the testing of integrated circuits and more particularly to the testing of delay paths of an integrated circuit.

BACKGROUND

It is desirable to reduce the amount of testing effort required for an integrated circuit design. Typically, integrated circuit devices based on the integrated circuit design are tested to ensure that the design operates according to a desired specification. In addition a number of integrated circuits of each production batch of the integrated circuit design are tested to ensure that the integrated circuits of the production batch comply with the specification.

Typically, one characteristic that is tested for in each production batch is the critical delay paths of the integrated circuit design. The critical delay paths are the delay paths that are most likely to violate the timing specification for the integrated circuit design. To test the critical delay paths, predicted critical delay paths are identified using prediction techniques based on design models of the integrated circuit design, and the delay paths identified by the prediction are tested during the testing process for the production batch. However, the actual critical delay paths of the integrated circuits of a production batch can vary from the predicted critical paths of the integrated circuit design due to process variations or other factors. Testing more of the delay paths of the production batch increases the likelihood that the actual critical paths have been tested, but at a cost of increased testing time. Accordingly, an improved method of identifying critical delay paths of an integrated circuit is desirable.

DETAILED DESCRIPTION

A method of testing critical delay paths of an integrated circuit design is disclosed. The method includes predicting and ranking a set of critical delay paths based on a set of predicted delay characteristics. Integrated circuits based on the integrated circuit design are tested to determine a set of actual delay measurements for the critical delay paths. The critical delay paths are ranked based on the actual delay measurements, and the results are correlated to the predicted ranking of critical delay paths to produce a confidence measurement that measures the likelihood that the actual critical delay paths of the design have been tested for a given production batch of devices. The confidence information can be used to improve quality control of the production of integrated circuits based on the integrated circuit design while reducing the amount of testing time for each batch. For example, the confidence measurement can be used to determine how many critical delay paths of each production batch of the integrated circuit design should be tested to ensure testing of the most critical delay paths for a set of production variables. In addition, the prediction technique used to develop the predicted critical delay paths can be modified based on the correlation results to improve the accuracy of the prediction technique and thereby improve reliability of the testing process.

Figure 1:
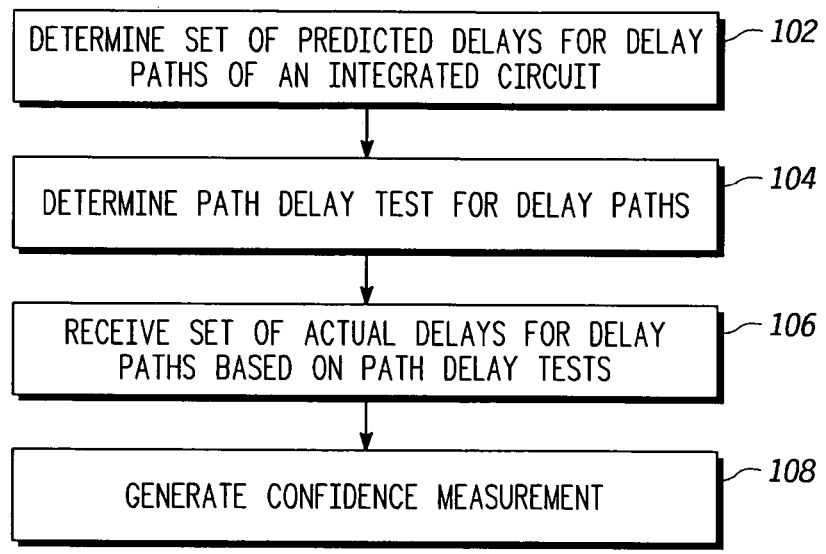
FIG. 1 is a flow diagram of a particular embodiment of a method of testing the timing delays of an integrated circuit design.

Referring to FIG. 1, a flow diagram of a particular embodiment of a method of testing the timing delays of an integrated circuit design is illustrated. At block 102, a set of predicted delay measurements for the delay paths of an integrated circuit are determined. The delay paths may be better understood with reference to FIG. 2.

Figure 2:
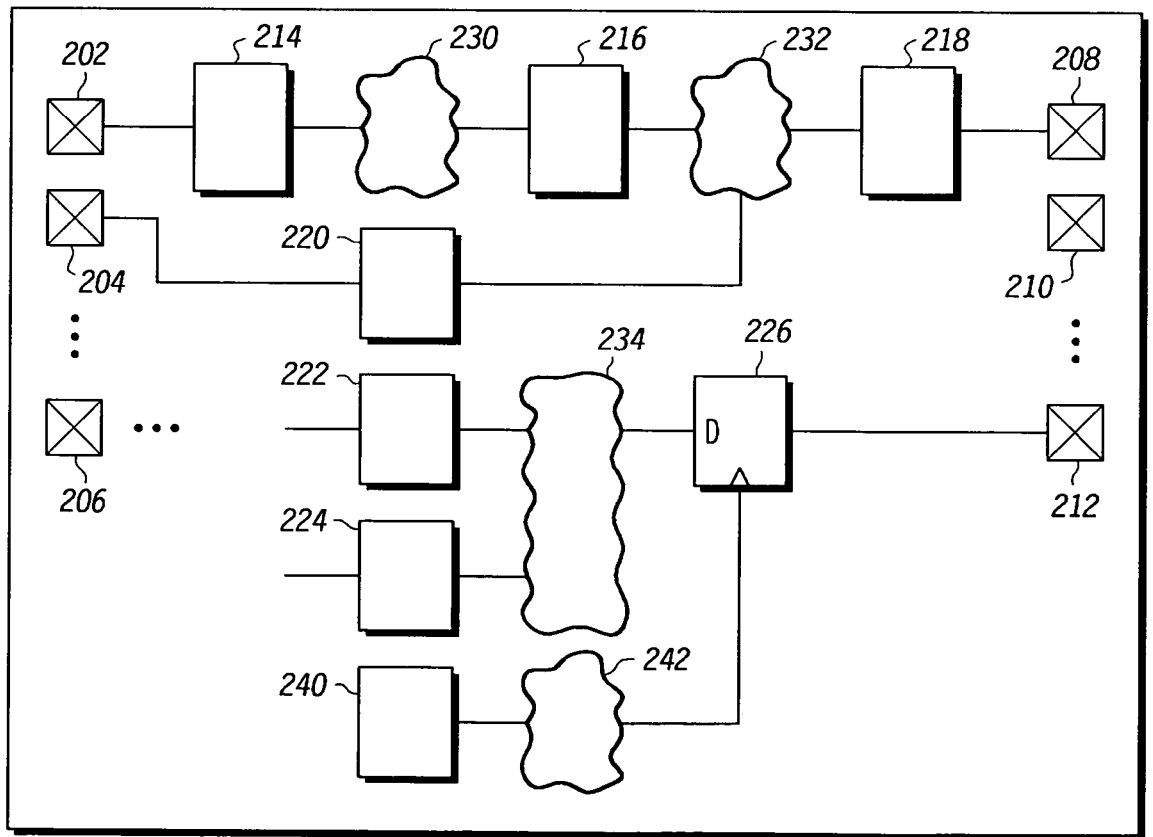
FIG. 2 is a block diagram of a particular embodiment of an integrated circuit illustrating the delay paths that can be tested according to the method of FIG. 1.

FIG. 2 illustrates a block diagram of a particular embodiment of an integrated circuit 200. The integrated circuit 200 includes a plurality of input pads, including input pads 202, 204, and 206 (input pads 204-206) and a plurality of output pads, including output pads 208, 210 and 212 (output pads 208-212). The input pads 204-206 and the output pads 208-212 may be input pins, output pins, input/output pins, bi-directional pins, or other appropriate device. The integrated circuit 200 further includes latches 214, 216, 218, 220, 222, 224, 226, and 240. The integrated circuit 200 also includes a number of logic clouds, including logic clouds 230, 232, 234, and 242. The logic clouds each represent a collection of logic circuits or logic elements interposed between latches.

In operation, the delay paths of the integrated circuit 200 are paths between latches. For example, there is a delay path between the latch 216 and the latch 214, and a delay path between the latch 218 and the latch 216. Each delay path has a delay that represents the amount of time between a change in the output of a latch and a signal change being received at a downstream latch, based upon the output change at the upstream latch. The delay associated with a delay path can be based on a number of factors, such as the delay associated with the logic cloud between the latches, the delay associated with the signal lines of the integrated circuit 200, and other factors. For example, the delay associated with the delay path between the latch 214 and the latch 216 can depend on the delay associated with the logic cloud 230, the delay associated with the lines connecting the latch 214 with the logic cloud 230, the line connecting the logic cloud 230 to the latch 216, and other factors.

A critical delay path is one which is predicted to impact whether the integrated circuit 200 will meet a desired specification in the event of process or other variations. For example, one type of critical delay path is a path that has a delay that will limit the clock speed for the integrated circuit 200. For example, if the delay of the delay path between the latch 216 and the latch is above a delay limit, the integrated circuit 200 can experience errors under specified clock speeds. Accordingly, if the predicted delay measurements indicate that the delay of the delay path is at or near this delay limit, the delay path is a critical delay path. The delay path is critical because process or other variations could result in the actual delay of the delay path being above the design limit.

Another type of critical delay path is a delay path that has a delay that is likely to impact the setup or hold time of a latch.

For example, the latch 240 supplies a clock signal to the latch 226 via the logic cloud 242. Accordingly, there is a first delay path between the latch 240 and the latch 226. In addition, the latch 222 supplies data to the latch 226 via the logic cloud 234. Accordingly there is a second delay path between the latch 226 and the latch 222. The relationship between the predicted delays of the first delay path and the second path should be such that a setup or hold time violation does not occur at the latch 226. If the relationship of the predicted delays is such that a process variation or other variation could result in a setup or hold time violation, then the first delay path and the second delay can both be critical delay paths.

Returning to block 102 of FIG. 1, the predicted delays for the delay paths of the integrated circuit can be developed in a number of ways. In a particular embodiment, static timing analysis (STA) can be performed on a design model of the integrated circuit to determine the predicted delays. Dynamic simulation or other delay prediction techniques could also be employed. Because an integrated circuit design can include a very large number of delay paths, a large number of predicted delays are typically generated for an integrated circuit design. It can be difficult and expensive to measure actual delays for all of the delay paths. Accordingly, a number of the critical delay paths are identified based on the predicted delays to develop a test set of delay paths.

At block 104, a set of path delay tests corresponding to the delay paths of the integrated circuit are determined. These path delay tests can include automatic test pattern generation (ATPG) tests or other appropriate tests. The path delay tests are typically developed for the test set of delay paths in order to reduce testing time for the integrated circuit design.

The path delay tests may be better understood by referring to FIG. 2. Each delay path of the integrated circuit can be tested by applying test data to control a latch of the delay path where the data is generated and determining the amount of time it takes for the data to arrive at the input of a next latch. For example, the delay path between the latch 218 and the latch 216 can be determined by applying a test input to the latch 216 (referred to as the launch latch) to generate a signal and measuring the amount of time it takes for the data stored in the latch 218 (referred to as the destination latch) to change. The time can be measured by iteratively clocking a test clock or other timing measurement. The test data may be applied to the latch 216 via a scan line or other appropriate input. Applications of test data to individual latches, rather than the input pads 204-206 allows testing of the internal delay paths of the integrated circuit 200.

Returning to FIG. 1, at block 106 a set of actual measured delays based on the path delay tests are received. The actual delays are measured by applying the path delay test to a set of integrated circuit devices based on the integrated circuit design. The measured delay for each delay path can be averaged across the integrated circuit devices, to calculate an average measured delay for each delay path in the test set.

At block 108, a confidence measurement is generated based on the set of predicted delays and the set of actual delays for the delay paths of the integrated circuit. The confidence measurement represents a confidence level that the most critical delay paths of the integrated circuit design have been identified and tested. In a particular embodiment, the confidence measurement is based on a correlation between the set of predicted delays and the set of actual delays. For example the delay paths may be ranked based on the set of predicted delays and the set of actual delays, and the confidence measurement generated based on the correlation between the rankings. The confidence measurement may be a confidence graph or other appropriate measurement.

Figure 3:
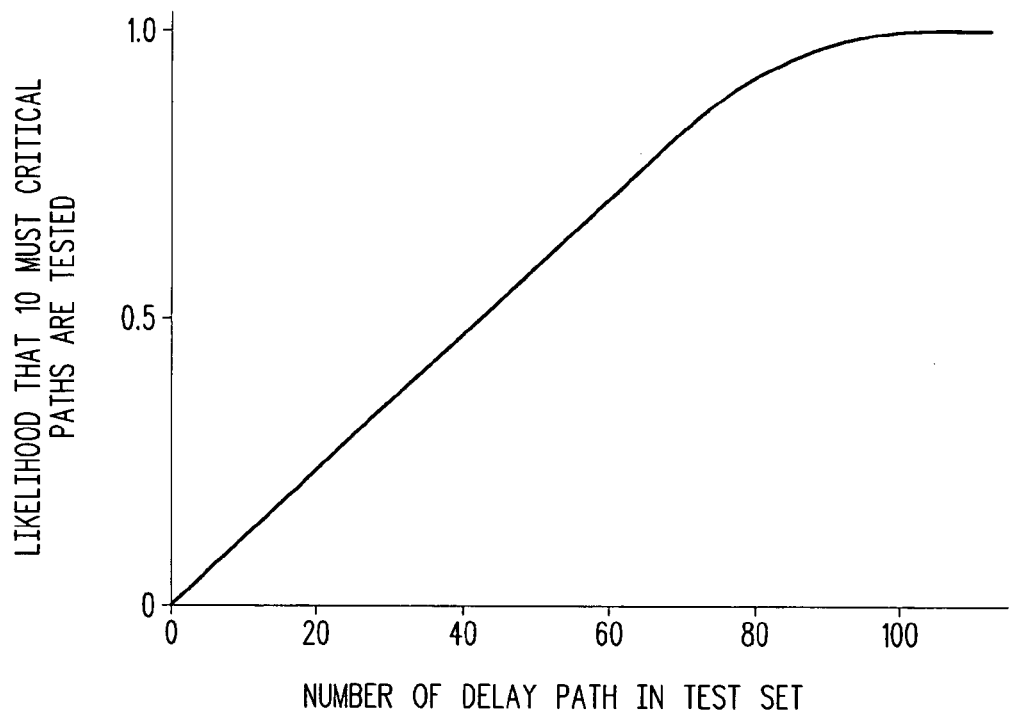
FIG. 3 is a diagram of a confidence curve that can be generated according to the method of FIG. 1.

An example of a confidence graph 300 is illustrated in FIG. 3. The x-axis of the graph 300 represents the number of delay paths in the test set, while the y-axis represents the degree of confidence that the 10 most critical delay paths will be tested in the testing process. Accordingly, the y-axis represents a number of statistical confidence levels. As illustrated, the number of delay paths in the test set increases, so does the likelihood that the most critical delay paths have been tested during the testing process. The confidence curve allows the selection of the appropriate number of delay paths to be placed in the test set according to a desired statistical confidence level. The shape of the confidence curve can vary for different production batches of integrated circuit devices because of process or other variations. Accordingly, new confidence curves can be developed for each production batch.

Figure 4:
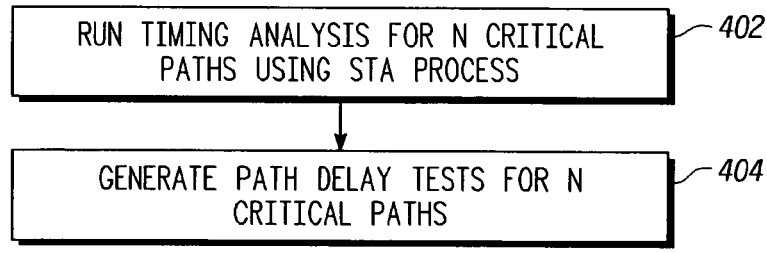
FIG. 4 is a flow diagram of a particular embodiment of a method of generating tests for a the delay paths of FIG. 2.

Referring to FIG. 4, a flow diagram of a particular embodiment of a method of generating tests for the test set of delay paths is illustrated. At block 402, a timing analysis is run to predict delays for the test set. The timing analysis uses an STA process to predict the N critical paths of the integrated circuit design.

Moving to block 404, path delay tests are generated for the N critical paths identified at step 402. These path delay tests can be applied to a set of test integrated circuits of the integrated circuit design to develop a set of actual delay measurements for the integrated circuit design. As explained, the actual delay measurements can be correlated with the predicted delay measurements to determine a confidence measurement that the most critical delay paths have been identified in the test integrated circuits.

Figure 5:
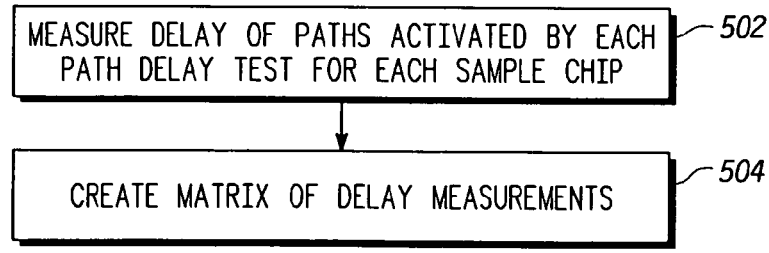
FIG. 5 is a flow diagram of a method of creating a matrix of measured delays for the delay paths of FIG. 2.

Referring to FIG. 5, a flow diagram of a method of creating a matrix of measured delays for a set of delay paths of an integrated circuit. At block 502, the delay paths of an integrated circuit design are measured on a set of sample integrated circuits. The measurements are performed using a set of delay path tests, such as the delay path tests discussed with respect to FIG. 4. At block 504, a matrix of the delay measurements is created. The matrix may be created so that the delay measurements are ranked to identify the most critical delay paths according to the measurements. The ranking of the critical delay paths based on the measurements can then be correlated with the ranking of the critical delay paths according based on the predicted delays. The correlation can be used to develop the confidence measurement between the predicted delays and the actual delays.

In a particular embodiment, a Pearson Product-Moment correlation equation is used for correlation analysis. Accordingly, the more critical silicon delay paths are given more weight than the less critical delay paths in the correlation analysis. In addition, the integrated circuits being tested can be divided into subgroups, with each subgroup having similar path rank correlation coefficient (PRCC) values. For each subgroup, a confidence curve can be generated. During the production process, the confidence curve that best matches each production batch may be used to determine the number of paths to test for the production batch.

Figure 6:
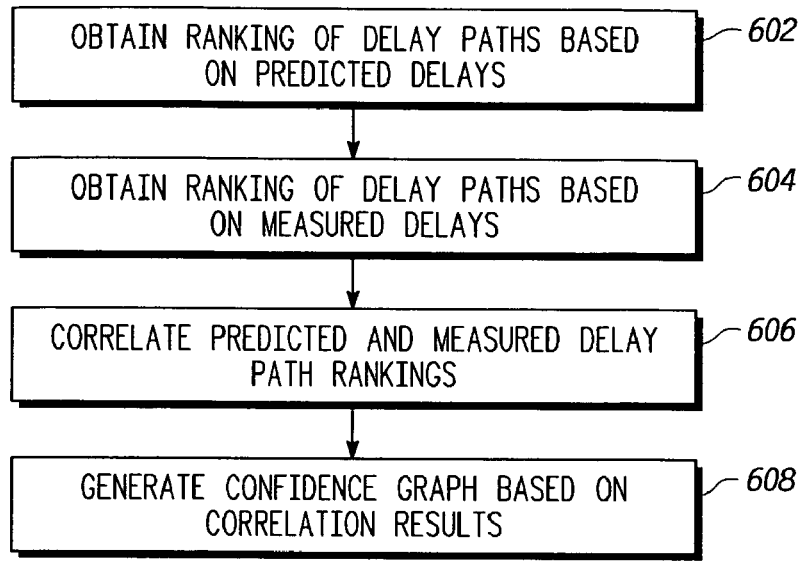
FIG. 6 is a flow diagram of a particular embodiment of a method for generating the confidence graph of FIG. 3.

Referring to FIG. 6, a flow diagram of a particular embodiment of a method for generating a confidence graph based on a correlation between a set of predicted delays and a set of measured delays for an integrated circuit design is illustrated. At block 602, a ranking of delay paths for an integrated circuit design is developed based on the predicted delays associated with the delay paths. Moving to block 604, a ranking of delay paths based on the measured delays of the paths is developed. At block 606, the predicted and measured delay path rankings are correlated. At block 608, a confidence graph based on the correlation results is generated. The confidence graph can be used to determine the testing process for production batches of the integrated circuit.

Figure 7:
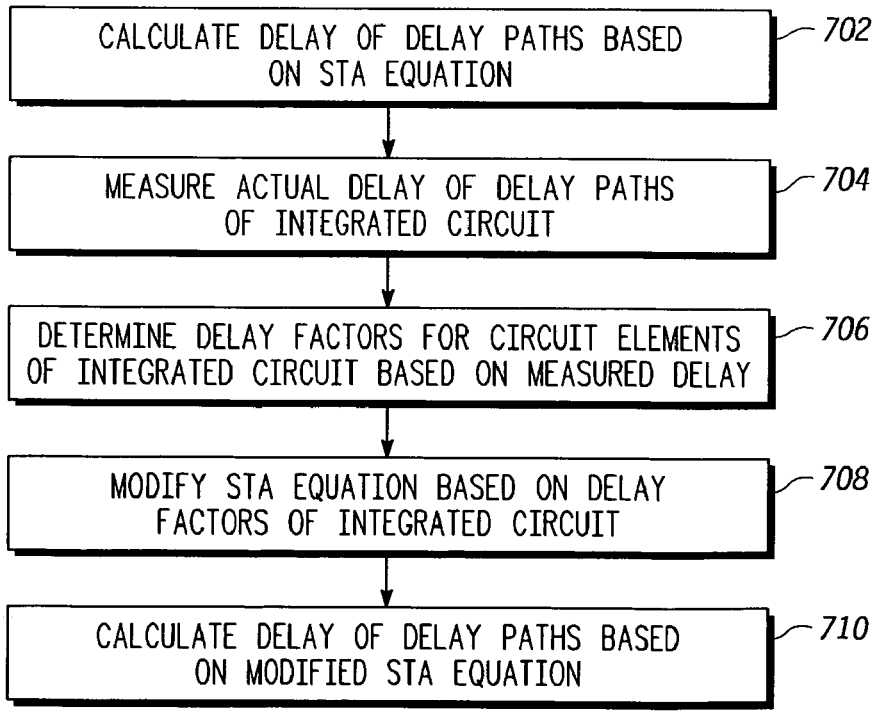
FIG. 7 is a flow diagram of a particular embodiment of a method of modifying the delay prediction equation that can be employed in conjunction with the method of FIG. 1.

Referring to FIG. 7, a flow diagram of a particular embodiment of a method of modifying a delay prediction equation based on a set of measured delays for an integrated circuit design is illustrated. At block 702, a set of predicted delays for delay paths of an integrated circuit design are developed using STA techniques. In a particular embodiment, the STA technique employs the following STA equation:

$$\text{Delay} = A * \sum c_i + B * \sum n_j + \text{setup}$$

where Delay is the predicted delay for a delay path, A is the delay factor associated with cell elements of the delay path, such as logic gates and the delay associated with the launch latch, $c_i$ represents the cell elements in the delay path, B is the delay factor associated with interconnects between the cell elements, $n_j$ represents the interconnects, and setup represents the delay associated with the setup time of the destination latch.

Moving to block 704, the actual delay of the delay paths of the integrated circuit are measured. At block 706, the delay factors, including the cell element delay factor, the interconnect delay factor, and the setup time delay, for circuit elements of the integrated circuit are determined based on the actual delay measurements. The delay factors are employed by the STA process to predict delays for the delay paths of the integrated circuit design.

Proceeding to block 708, the STA equation is modified based on the measured delay factors of the integrated circuit. For example, if the measured delay factors indicate that the factor A in the above formula does not accurately represent the actual cell delay for the delay path, the STA equation is modified to use a different value for A. Moving to block 710, the delay of the test set of delay paths of the integrated circuit design are predicted using the modified STA equation. This modified STA equation provides a more accurate prediction of the critical delay paths for the integrated circuit design, allowing for a more efficient testing procedure.

It will be appreciated that other STA equations may be used to determine the set of predicted delays. For example, an STA equation may be employed that includes different delay factors for different types of logic gates.

It will be appreciated that the methods described herein may be implemented as, for example, a computer readable medium that embodies executable instructions that manipulate a processor or other computation system to perform the functions described herein.

In addition, the various methods in the present application may be implemented using an information handling machine such as a data processor, or a plurality of processing devices. Such a data processor may be a microprocessor, microcontroller, microcomputer, digital signal processor, state machine, logic circuitry, and/or any device that manipulates digital information based on operational instruction, or in a predefined manner. Generally, the methods readily implemented by one of ordinary skill in the art using one or more of the implementation techniques listed herein.

When a data processor for issuing instructions is used, the instruction may be stored in memory. Such a memory may be a single memory device or a plurality of memory devices. Such a memory device may be a computer readable medium such as a read-only memory device, random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic. Such an information handling machine may be a system, or part of a system, such as a computer, a personal digital assistant (PDA), a hand held computing device, a cable set-top box, an Internet capable device, such as a cellular phone, and the like.

A method of testing critical delay paths of an integrated circuit design is disclosed. In a particular embodiment, the method includes determining a first set of predicted delays corresponding to a first set of delay paths for an integrated circuit design, receiving a set of actual delays associated with a first plurality of integrated circuits corresponding to the first set of delay paths, and determining a confidence measurement that a most critical delay path is included in the first set of delay paths, the confidence measurement based on the first set of predicted delays and the set of actual delays.

In a particular aspect, determining the confidence measurement includes determining a first ranking of the first set of delay paths based on the first set of predicted delays, determining a second ranking of the first set of delay paths based on the set of actual delays, and correlating the first ranking and the second ranking. In a particular aspect, the confidence measurement is based on the correlation between the first ranking and the second ranking. In another particular aspect, the confidence measurement is associated with a plurality of statistical confidence levels.

In another particular aspect, the method includes determining for one of the plurality of statistical confidence levels a number of delay paths to be tested in an integrated circuit device of a second plurality of integrated circuit devices. In still another particular aspect, the number of delay paths is based on a likelihood of identifying a set of most critical paths.

In a particular aspect, the method includes generating a confidence graph based on the confidence measurement. In another particular aspect, the set of predicted delays are determined using a first static timing analysis (STA) equation. In another particular aspect the method includes modifying the first STA equation based on the set of actual delays to produce a second STA equation. In yet another particular aspect the first static timing analysis equation comprises a plurality of delay factors, and wherein modifying the first static timing analysis equation comprises modifying one or more of the delay factors. In still another particular aspect, one of the plurality of delay factors is a cell delay factor associated with a predicted delay of a latch of the integrated circuit design. In a particular aspect one of the plurality of delay factors is an interconnect delay factor associated with a predicted delay of a circuit path of the integrated circuit design. In another particular aspect one of the plurality of delay factors is a setup delay factor associated with a predicted setup time of a latch of the integrated circuit design. In still another particular aspect, one of the plurality of delay element factors is a cell element delay factor associated with a predicted delay of a cell element of the integrated circuit design. In a particular aspect, the method includes determining a second set of predicted delays for the integrated circuit design based on the second STA equation.

A device for testing critical delay paths of an integrated circuit design is disclosed. In a particular embodiment, the device includes a computer readable medium including a computer program. In a particular aspect, the computer program includes instructions to determine a first set of predicted delays corresponding to a first set of delay paths for an integrated circuit design, instructions to receive a set of actual delays associated with a first plurality of integrated circuits corresponding to the first set of delay paths, and instructions to determine a confidence measurement that a most critical delay path is included in the first set of delay paths. In a particular aspect, the confidence measurement based on the first set of predicted delays and the set of actual delays.

In another particular aspect the computer program further includes instructions to determine a first ranking of the first set of delay paths based on the first set of predicted delays, instructions to determine a second ranking of the first set of delay paths based on the set of actual delays, and instructions to correlate the first ranking and the second ranking. In a particular aspect, the confidence measurement is based on the correlation between the first ranking and the second ranking. In another particular aspect, the confidence measurement includes a plurality of statistical confidence levels, and the computer program further includes instructions to determine for one of the plurality of statistical confidence levels a number of actual delay paths to be tested of a second plurality of integrated circuit devices.

In a particular aspect, the first set of predicted delays are determined based on a first static timing analysis equation and the computer program further includes instructions to modify the first static timing analysis equation based on the set of actual delays to produce a second static timing analysis equation. In another particular aspect, the computer program includes instructions to determine a second set of predicted delays for the integrated circuit design based on the second static timing analysis equation. In yet another particular embodiment, the computer program includes instructions to generate a confidence graph based on the confidence measurement.

The disclosure has been described with reference to specific embodiments. However, it will be appreciated that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A method, comprising:
   determining at a processor a first set of predicted delays corresponding to a first set of delay paths for an integrated circuit design;
   receiving at the processor a set of actual delays associated with a first plurality of integrated circuits corresponding to the first set of delay paths; and
   determining at the processor a confidence measurement that a most critical delay path is included in the first set of delay paths, the confidence measurement based on the first set of predicted delays and the set of actual delays.

2. The method of claim 1, wherein determining the confidence measurement comprises
   determining at the processor a first ranking of the first set of delay paths based on the first set of predicted delays;
   determining at the processor a second ranking of the first set of delay paths based on the set of actual delays; and
   correlating at the processor the first ranking and the second ranking;
   wherein the confidence measurement is based on the correlation between the first ranking and the second ranking.

3. The method of claim 1, wherein the confidence measurement is associated with a plurality of statistical confidence levels.

4. The method of claim 3 further comprising determining for one of the plurality of statistical confidence levels a number of delay paths to be tested in an integrated circuit device of a second plurality of integrated circuit devices.

5. The method of claim 4, wherein the number of delay paths is based on a likelihood of identifying a set of most critical paths.

6. The method of claim 1, further comprising generating a confidence graph based on the confidence measurement.

7. The method of claim 1, wherein the first set of predicted delays are determined using a first static timing analysis (STA) equation.

8. The method of claim 7, further comprising:
   modifying the first STA equation based on the set of actual delays to produce a second STA equation.

9. The method of claim 8, wherein the first static timing analysis equation comprises a plurality of delay factors, and wherein modifying the first static timing analysis equation comprises modifying one or more of the delay factors.

10. The method of claim 9, wherein one of the plurality of delay factors is a cell delay factor associated with a predicted delay of a latch of the integrated circuit design.

11. The method of claim 9, wherein one of the plurality of delay factors is an interconnect delay factor associated with a predicted delay of a circuit path of the integrated circuit design.

12. The method of claim 9, wherein one of the plurality of delay factors is a setup delay factor associated with a predicted setup time of a latch of the integrated circuit design.

13. The method of claim 9, wherein one of the plurality of delay factors is a cell element delay factor associated with a predicted delay of a cell element of the integrated circuit design.

14. The method of claim 8, further comprising:
   determining a second set of predicted delays for the integrated circuit design based on the second STA equation.

15. A computer readable medium tangibly embodying a computer program, the computer program comprising:
   instructions to determine a first set of predicted delays corresponding to a first set of delay paths for an integrated circuit design;
   instructions to receive a set of actual delays associated with a first plurality of integrated circuits corresponding to the first set of delay paths; and
   instructions to determine a confidence measurement that a most critical delay path is included in the first set of delay paths, the confidence measurement based on the first set of predicted delays and the set of actual delays.

16. The computer readable medium of claim 15, wherein the computer program further comprises:

instructions to determine a first ranking of the first set of delay paths based on the first set of predicted delays;

instructions to determine a second ranking of the first set of delay paths based on the set of actual delays; and instructions to correlate the first ranking and the second ranking;

wherein the confidence measurement is based on the correlation between the first ranking and the second ranking.

17. The computer readable medium of claim 15, wherein the confidence measurement includes a plurality of statistical confidence levels, and wherein the computer program further comprises:

instructions to determine for one of the plurality of statistical confidence levels a number of actual delay paths to be tested of a second plurality of integrated circuit devices.

18. The computer readable medium of claim 15, wherein the first set of predicted delays are determined based on a first static timing analysis equation and wherein the computer program further comprises:

instructions to modify the first static timing analysis equation based on the set of actual delays to produce a second static timing analysis equation.

19. The computer readable medium of claim 18, wherein the computer program further comprises:

instructions to determine a second set of predicted delays for the integrated circuit design based on the second static timing analysis equation.

20. The computer readable medium of claim 15, wherein the computer program further comprises:

instructions to generate a confidence graph based on the confidence measurement.

* * * * *